(12) United States Patent
Zhang

(10) Patent No.: US 12,486,456 B2
(45) Date of Patent: Dec. 2, 2025

(54) QUANTUM DOT STRUCTURE, QUANTUM DOT LIGHT EMITTING DEVICE, AND MANUFACTURING METHOD

(71) Applicant: BOE Technology Group Co., Ltd., Beijing (CN)

(72) Inventor: Zhenqi Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 522 days.

(21) Appl. No.: 17/921,305

(22) PCT Filed: Jun. 8, 2021

(86) PCT No.: PCT/CN2021/098843
§ 371 (c)(1),
(2) Date: Oct. 25, 2022

(87) PCT Pub. No.: WO2022/022073
PCT Pub. Date: Feb. 3, 2022

(65) Prior Publication Data
US 2023/0257650 A1 Aug. 17, 2023

(30) Foreign Application Priority Data

Jul. 31, 2020 (CN) .......................... 202010756576.6

(51) Int. Cl.
*C09K 11/88* (2006.01)
*C09K 11/02* (2006.01)
(Continued)

(52) U.S. Cl.
CPC .......... *C09K 11/883* (2013.01); *C09K 11/025* (2013.01); *H10K 50/115* (2023.02);
(Continued)

(58) Field of Classification Search
CPC . H01L 25/167; H01L 21/026; H10F 77/1433; H10F 77/1437; H10H 20/812;
(Continued)

(56) References Cited

U.S. PATENT DOCUMENTS

2010/0108984 A1  5/2010  Cho et al.
2018/0148638 A1  5/2018  Ahn et al.
(Continued)

FOREIGN PATENT DOCUMENTS

CN  106083573 A  11/2016
CN  108110144 A   6/2018
(Continued)

OTHER PUBLICATIONS

Hong, Liang, Shan Jiang, and Steve Granick. "Simple method to produce Janus colloidal particles in large quantity." Langmuir 22.23 (2006): 9495-9499.

(Continued)

*Primary Examiner* — Brook Kebede
(74) *Attorney, Agent, or Firm* — IPro, PLLC

(57) ABSTRACT

Provided by the present disclosure are a quantum dot structure, a quantum dot light emitting device, and a manufacturing method. The quantum dot structure comprises: a quantum dot body; a first ligand, the first ligand being connected to one side surface of the quantum dot body by means of a first coordinate bond, and the first ligand having the property of regulating the transmission rate of a first charge carrier; and a second ligand, the second ligand being connected to another side surface of the quantum dot body by means of a second coordinate bond, and the second ligand having the property of regulating the transmission rate of a second charge carrier, where the charge polarities of the second charge carrier and the first charge carrier are different.

15 Claims, 6 Drawing Sheets

(51) Int. Cl.
  *H10K 50/115* (2023.01)
  *H10K 85/00* (2023.01)
  *B82Y 20/00* (2011.01)
  *B82Y 40/00* (2011.01)

(52) U.S. Cl.
  CPC .............. *H10K 85/00* (2023.02); *B82Y 20/00* (2013.01); *B82Y 40/00* (2013.01)

(58) Field of Classification Search
  CPC .. H10H 20/8131; H10H 20/822; H10K 85/00; H10K 50/115; B82Y 20/00; B82Y 40/00; C09K 11/025; C09K 11/883; G01N 33/588; G02B 6/0229
  See application file for complete search history.

(56) References Cited

U.S. PATENT DOCUMENTS

| | | |
|---|---|---|
| 2018/0215695 A1 | 8/2018 | Chen |
| 2018/0372637 A1* | 12/2018 | He .................. H10K 50/115 |
| 2019/0081263 A1 | 3/2019 | Park et al. |
| 2019/0292447 A1 | 9/2019 | Qiu et al. |
| 2019/0367805 A1 | 12/2019 | Kim et al. |
| 2020/0073178 A1* | 3/2020 | Lee .................. H10H 20/812 |
| 2020/0075877 A1 | 3/2020 | Yu |
| 2020/0083470 A1 | 3/2020 | Chung et al. |
| 2022/0340812 A1 | 10/2022 | Nie et al. |

FOREIGN PATENT DOCUMENTS

| | | | |
|---|---|---|---|
| CN | 108550707 A | | 9/2018 |
| CN | 109486491 A | | 3/2019 |
| CN | 109790452 A | | 5/2019 |
| CN | 109824840 A | | 5/2019 |
| CN | 109935670 A | | 6/2019 |
| CN | 109935739 A | | 6/2019 |
| CN | 110551495 A | | 12/2019 |
| CN | 112018270 A | | 12/2020 |
| CN | 113025308 A | | 6/2021 |
| KR | 20190029193 A | * | 3/2019 |

OTHER PUBLICATIONS

CN202010756576.6 first office action.
CN202010756576.6 second office action.
CN202010756576.6 Decision of Rejection.
PCT/CN2021/098843 international search report.

* cited by examiner

QUANTUM DOT STRUCTURE, QUANTUM DOT LIGHT EMITTING DEVICE, AND MANUFACTURING METHOD

CROSS REFERENCE TO RELATED APPLICATIONS

This application is a US National Stage of International Application No. PCT/CN2021/098843, filed on Jun. 8, 2021, which claims the priority of Chinese Patent Application No. 202010756576.6, filed with the China National Intellectual Property Administration on Jul. 31, 2020 and entitled "QUANTUM DOT STRUCTURE, QUANTUM DOT LIGHT EMITTING DEVICE, AND MANUFACTURING METHOD," which is hereby incorporated by reference in its entirety.

TECHNICAL FIELD

The disclosure relates to the technical field of display, in particular to a quantum dot structure, a quantum dot light emitting device, and a manufacturing method.

BACKGROUND

The efficiency of a quantum dot light emitting device is mainly related to the internal quantum efficiency of a material, the injection balance of carriers, the light emission efficiency of the device, and the like. The three factors correspond to the quantum yield of the material, the electrical structure of the device, the optical structure of the device, respectively. While in terms of the electrical structure of the device, a device with high efficiency and long service life can be obtained by optimizing a hole transport layer and an electron transport layer and balancing the injection of two carriers, namely holes and electrons. Typically, in the quantum dot light emitting device, injection of holes is harder, and injection of electrons is easier, and thus, two methods are generally employed to optimize the device structure. One method is to use multiple hole transport layers to make a barrier step-like to increase injection of hole carriers. The other method is to reduce the injection of electrons by inserting an insulating layer between the electron transport layer and quantum dots.

SUMMARY

An embodiment of the disclosure provides a quantum dot structure, including: a quantum dot body; a first ligand connected with a side surface of the quantum dot body by a first coordinate bond and having the property of regulating a transport rate of a first carrier; and a second ligand connected with the other side surface of the quantum dot body by a second coordinate bond and having the property of regulating a transport rate of a second carrier. Here the charge polarity of the second carrier is opposite to that of the first carrier.

In some embodiments, the first ligand includes a first coordinating group and a first non-coordinating group, and the first coordinating group is connected with the quantum dot body and the first non-coordinating group, and the first non-coordinating group has the property of regulating the transport rate of the first carrier. The second ligand includes a second coordinating group and a second non-coordinating group, and the second coordinating group is connected with the quantum dot body and the second non-coordinating group, and the second non-coordinating group has the property of regulating the transport rate of the second carrier.

In some embodiments, the polarity of the first ligand is different from that of the second ligand.

In some embodiments, the first non-coordinating group includes a first sub non-coordinating group and a second sub non-coordinating group, and the second sub non-coordinating group has the property of regulating the transport rate of the first carrier. The second non-coordinating group includes a third sub non-coordinating group and a fourth sub non-coordinating group, and the fourth sub non-coordinating group has the property of regulating the transport rate of the second carrier. The polarity of the first sub non-coordinating group is different from that of the third sub non-coordinating group.

In some embodiments, the first sub non-coordinating group is one of the following groups: a hydrophilic group, a hydrophobic group, or a non-hydrophilic and non-hydrophobic group. The third sub non-coordinating group is one of the following groups: a hydrophilic group, a hydrophobic group, or a non-hydrophilic and non-hydrophobic group.

In some embodiments, the hydrophilic group includes one or a combination of: hydroxyl or $-(OCH_2CH_2)_n-$, and $n \geq 1$. The hydrophobic group includes one or a combination of: hydrocarbyl, a benzene ring, or alkyl. The non-hydrophilic and non-hydrophobic group includes one or a combination of: a fluorine atom, or trifluoromethyl.

In some embodiments, the first carrier is the hole, and the first ligand has the property of promoting the transport rate of the first carrier; and the second carrier is the electron, and the second ligand has the property of promoting the transport rate of the second carrier. The second sub non-coordinating group includes one or a combination of: carbazole, triphenylamine, or arylamine. The fourth sub non-coordinating group includes one or a combination of: a benzene ring or pyridine.

In some embodiments, the first carrier is the hole, and the first ligand has the property of blocking the transport rate of the first carrier; and the second carrier is the electron, and the second ligand has the property of blocking the transport rate of the second carrier. The second sub non-coordinating group includes one or a combination of: long-chain alkyl, or a non-conjugated group. The fourth sub non-coordinating group includes one or a combination of: long-chain alkyl or a non-conjugated group.

In some embodiments, the first ligand includes one or a combination of:

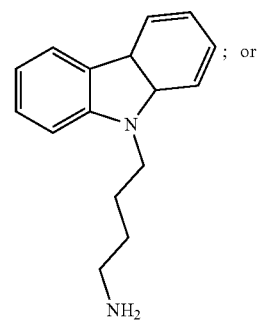

; or

-continued

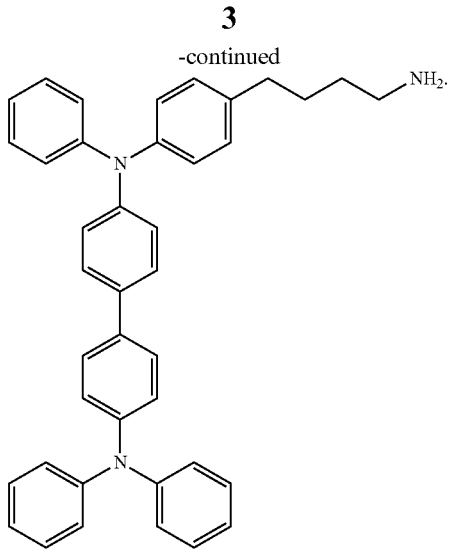

In some embodiments, the first non-coordinating group has the property of regulating the transport rate of the first carrier, and is one of the following groups: a hydrophilic group, a hydrophobic group; or a non-hydrophilic and non-hydrophobic group. The second non-coordinating group has the property of regulating the transport rate of the second carrier, and is one of the following groups: a hydrophilic group, a hydrophobic group, or a non-hydrophilic and non-hydrophobic group. The polarity of the first non-coordinating group is different from that of the second non-coordinating group.

In some embodiments, the first ligand includes one or a combination of:

octyl;

phenyl;

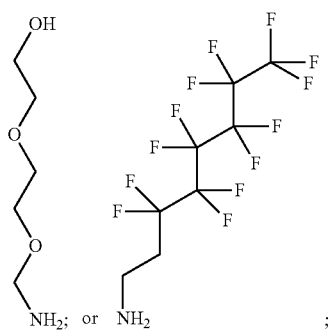 [SMILES: NCOCCOCCO ; "or" ; NCCC(F)(F)C(F)(F)C(F)(F)C(F)(F)C(F)(F)C(F)(F)F]

and the second ligand includes one or a combination of octyl;

phenyl;

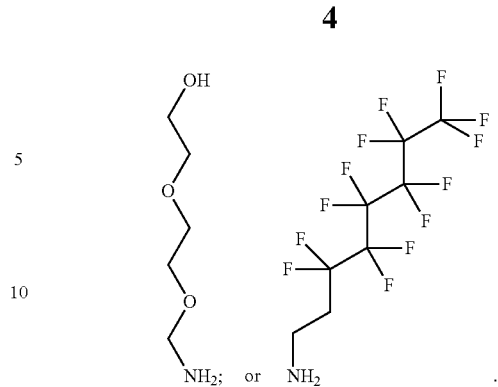

In some embodiments, the first coordinating group and the second coordinating group include one or a combination of: mercapto, amino, carboxyl, or phosphoric acid.

In some embodiments, the quantum dot body is of a core structure or the quantum dot body is of a core-shell structure.

An embodiment of the disclosure also provides a manufacturing method for the quantum dot structure provided by the embodiment of the disclosure, including: dispersing quantum dots containing a reactive group in an oil dissolving liquid and mixing with water to form an emulsion; cooling the emulsion to precipitate microspheres adsorbed with the quantum dots; adding a first liquid containing first atoms to the emulsion in which the microspheres are precipitated to react with the reactive group to obtain quantum dots with the first atoms modified on a side surface in contact with the first liquid; dissolving the microspheres to obtain dispersed quantum dots; adding a first monomer having a regulating effect on a second carrier, and subjecting the first monomer and positions of the quantum dots containing the first atoms to an atom transfer radical polymerization reaction to obtain quantum dots with a second ligand on a side surface; and adding a second monomer having a regulating effect on a first carrier to react with the reactive group to obtain the quantum dot structure with a first ligand on other side surface.

In some embodiments, the dispersing quantum dots containing a reactive group in an oil-soluble liquid to be mixed with water to form an emulsion includes: dispersing quantum dots containing an aminothiol ligand in molten paraffin liquid and mixing with water to form the emulsion, and mercapto is connected with the quantum dots, and amino is used as the reactive group.

In some embodiments, the adding a first liquid containing first atoms to the emulsion in which the microspheres are precipitated to react with the reactive group to obtain quantum dots with the first atoms modified on one side surface in contact with the first liquid includes: adding 2-bromoisobutyric acid containing bromine atoms to the emulsion in which the microspheres are precipitated to react with the amino to obtain the quantum dots with the bromine atoms modified on one side surface in contact with the 2-bromoisobutyric acid.

An embodiment of the disclosure also provides a quantum dot light emitting device, including: a base substrate; a first electrode, on a side of the base substrate; a second electrode, on a side of the first electrode facing away from the base substrate; and a quantum dot structure, between the first electrode and the second electrode. The quantum dot structure is the quantum dot light-emitting structure provided by the embodiment of the disclosure. The side surface of the quantum dot structure having a first ligand is located on a side of the quantum dot body facing the first electrode, and configured to regulate a transport rate of a first carrier injected by the first electrode. The other side surface of the quantum dot structure having a second ligand is located on the side of the quantum dot body facing the second electrode, and configured to regulate a transport rate of a second carrier injected by the second electrode.

In some embodiments, the quantum dot light emitting device further includes a first function layer between the quantum dot structure and the first electrode, and the polarity of the first ligand is the same as that of the first function layer; and a second function layer between the quantum dot structure and the second electrode, and the polarity of the second ligand is the same as that of the second function layer.

An embodiment of the disclosure also provides a manufacturing method for a quantum dot light emitting device, including: providing a base substrate; forming a first electrode on a side of the base substrate; forming a first function layer on a side of the first electrode facing away from the base substrate; forming the quantum dot structure according to any one of claims 1-13 on a side of the first function layer facing away from the first electrode, and a first ligand, having same polarity as the first function layer, of the quantum dot structure is self-assembled with the first function layer; forming a second function layer on a side of the quantum dot structure facing away from the first electrode, and the second function layer is self-assembled with the second ligand having same polarity as the quantum dot structure; and forming a second electrode on a side of the second function layer facing away from the quantum dot structure.

DETAILED DESCRIPTION

In order to make the purpose, the technical solution and the advantages of the embodiments of the disclosure clearer, the technical solution of the embodiments of the disclosure is clearly and completely described below in combination with the accompanying drawings of the embodiments of the disclosure. Obviously, the described embodiments are some, but not all, of the embodiments of the disclosure. Based on the described embodiments of the disclosure, all other embodiments obtained by those of ordinary skill in the art without inventive efforts fall within the scope of protection of the disclosure.

Unless otherwise defined, the technical or scientific terms used in the disclosure should have general meaning understood by those of ordinary skill in the art to which the disclosure belongs. The words "first", "second" and the like used in the disclosure do not indicate any order, quantity or importance, but are only used to distinguish different components. "Include" or "comprise" and other similar words mean that an element or an item preceding the word cover elements or items and their equivalents listed behind the word without excluding other elements or items. "Connection" or "connected" and the like are not limited to physical or mechanical connections, but can include electrical connections, whether direct or indirect. "Upper", "lower", "left", "right" and the like are only used for representing a relative position relation, and when an absolute position of a described object is changed, the relative position relation can also be correspondingly changed.

To keep the following description of the embodiments of the disclosure clear and concise, the disclosure omits detailed descriptions of well-known functions and well-known components.

Figure 1:
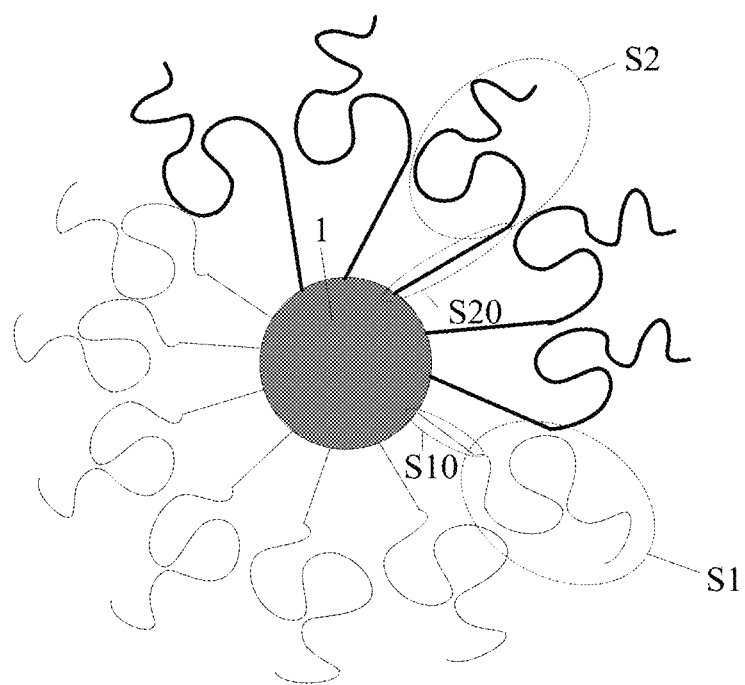
FIG. 1 is a schematic diagram of a quantum dot structure according to an embodiment of the disclosure.

Referring to FIG. 1, an embodiment of the disclosure provides a quantum dot structure, including:

a quantum dot body 1, and the quantum dot body 1 may be of a core structure, e.g. containing only a CdSe core or only a InP core; or, the quantum dot body 1 may also be core-shell structured, e.g. ZnS/CdSe core-shell structure or InP/ZnSc ore-shell structure;

a first ligand S1, connected with a side surface (e.g., a first outer surface) of the quantum dot body 1 by a first coordinate bond S10 and having the property of regulating a transport rate of a first carrier; and the first ligand S1 may promote the transport rate of the first carrier to facilitate the transport of the first carrier; and may slow the transport rate of the first carrier to block the transport of the first carrier; and a second ligand S2, connected with another side surface (e.g. a second outer surface) of the quantum dot body 1 by a second coordinate bond S20 and having the property of regulating a transport rate of a second carrier, and the charge polarity of the second carrier is opposite to that of the first carrier, and the second outer surface and the first outer surface are two opposite outer surfaces of the quantum dot body 1; the second ligand S2 may promote a transport rate of a second carrier to facilitate the transport of the second carrier; and may also slow the transport rate of the second carrier to block the transport of the second carrier; and the first carrier may be a hole and the second carrier may be an electron; or, the first carrier may be the electron and the second carrier may be the hole.

In embodiments of the disclosure, the quantum dot structure includes a first ligand S1 located on one side surface of the quantum dot body 1, and a second ligand S2 located on the other side surface of the quantum dot body 1, and the first ligand S1 has the property of regulating a transport rate of a first carrier, and the second ligand S2 has the property of regulating a transport rate of second carrier, so that the transport rates of two carriers opposite in charge polarity can be regulated simultaneously by the quantum dot structure itself, and the injection balance of the two carriers can be controlled. When the quantum dot structure is applied to a quantum dot light emitting device, the luminous efficiency of the quantum dot light emitting device can be effectively improved.

In some embodiments, the first ligand S1 may have the property of promoting a transport rate of holes, the HOMO energy level of the first ligand S1 is located between the HOMO energy level of a hole injection layer and the HOMO energy level of a quantum dot light-emitting layer when a quantum dot light emitting device is formed. In some embodiments, the hole mobility of the first ligand S1 is greater than $10^{-5}$ cm/V·s and less than $10^{-3}$ cm/V·s. The second ligand S2 may have the property of promoting a transport rate of electrons, the LUMO energy level of the second ligand S2 is located between the LUMO energy level of an electron injection layer and the LUMO energy level of the quantum dot light-emitting layer when the quantum dot light emitting device is formed. In some embodiments, the electron mobility of the second ligand S2 is greater than $10^{-6}$ cm/V·s and less than $10^{-3}$ cm/V·s. The second ligand S2 may have the property of slowing down the transport rate of electrons, the LUMO energy level of the second ligand S2 is higher than the LUMO energy level of an electron transport layer, and higher than the LUMO energy level of the quantum dot light-emitting layer when the quantum dot light emitting device is formed, and specifically, the electron mobility of the second ligand S2 is less than $10^{-5}$ cm/V·s.

In some embodiments, a regulating effect of the second ligand S2 on the transport rate of the second carrier may be different from a regulating effect of the first ligand S1 on the transport rate of the first carrier. For example, the second ligand S2 can have a blocking effect on the transport rate of the second carrier, while the first ligand S1 can have a promoting effect on the transport rate of the first carrier. By taking the first carrier being the hole and the second carrier being the electron as an example, since it is generally easy to inject electrons and difficult to inject holes in a quantum dot light emitting device, making the second ligand S2 have the electron blocking effect while the first ligand S1 have hole transport property, which is conducive to balancing the injection of electrons and holes to improving the luminous efficiency of the quantum dot light emitting device. Of course, the regulating effect of the second ligand S2 on the transport rate of the second carrier may also be the same as the regulating effect of the first ligand S1 on the transport rate of the first carrier, for example, both have a blocking effect so as to be suitable in other device structures having different application requirements for the quantum dot structure.

In some embodiments, the quantum dot body 1 may be a sphere, and as shown in FIG. 1, the quantum dot body 1 of the sphere may have two opposite first hemisphere and second hemisphere, the first ligands S1 may be distributed on the outer surface of the first hemisphere of the quantum dot body 1, and the second ligands S2 may be distributed on the outer surface of the second hemisphere of the quantum dot body 1. In some embodiments, the first ligands S1 may be distributed allover the one side surface and the second ligands S2 may be distributed allover the other side surface.

In some embodiments, the first ligand S1 includes a first coordinating group X1 and a first non-coordinating group YT, and the first coordinating group X1 (e.g., NH2 in FIG. 1) is connected with the quantum dot body 1 and the first non-coordinating group YT, and the first non-coordinating group Y1 has the property of regulating a transport rate of a first carrier; and the second ligand S2 includes a second coordinating group X2 and a second non-coordinating group Y2, and the second coordinating group X2 (e.g., NH in FIG. 1) is connected with the quantum dot body 1 and the second non-coordinating group Y2, and the second non-coordinating group Y2 has the property of regulating a transport rate of a second carrier. In embodiments of the disclosure, the regulating effect of the first ligand S1 on the first carrier can be achieved by the first non-coordinating group YT, the regulating effect of the second ligand S2 on the second carrier can be achieved by the second non-coordinating group Y2, the first coordinating group X1 may connect the first non-coordinating group Y1 with the quantum dot body 1, and the second coordinating group X2 may connect the second non-coordinating group Y2 with the quantum dot body 1.

In some embodiments, the first coordinating group X1 and the second coordinating group X2 include one or a combination of: mercapto, amino, carboxyl, and phosphoric acid. In some embodiments, the first coordinating group X1 of the first ligand S1 and the second coordinating group X2 of the second ligand S2 may be a same group, which is conducive to simplifying the preparation of the quantum dot structure. For example, the first coordinating group X1 and the second coordinating group X2 may both be amino; or, the first coordinating group X1 of the first ligand S1 and the second coordinating group X2 of the second ligand S2 may also be different groups, for example, the first coordinating group X1 is mercapto and the second coordinating group X2 is amino.

In some embodiments, the polarity of the first ligand S1 is different from that of the second ligand S2. In particular, the first non-coordinating group Y1 includes a first sub non-coordinating group YTT and a second sub non-coordinating group Y12, and the second sub non-coordinating group Y12 has the property of regulating a transport rate of a first carrier. The second non-coordinating group Y2 includes a third sub non-coordinating group Y21 and a fourth sub non-coordinating group Y22, and the fourth sub non-coordinating group Y22 has the effect of regulating a transport rate of a second carrier. The polarity of the first sub non-coordinating group Y11 is different from that of the third sub non-coordinating group Y21, so that different polarities of the first ligand S1 and the second ligand S2 may be achieved by different polarities of the first sub non-coordinating group Y11 and the third sub non-coordinating group Y21. In embodiments of the disclosure, the second sub non-coordinating group Y12 and the fourth non-coordinating group Y22 may be related groups which regulate the transport rate of carriers, the first sub non-coordinating group YTT and the third sub non-coordinating group Y21 may be groups related to hydrophilicity, hydrophobicity, or non-hydrophilicity and non-hydrophobicity (i.e., neither hydrophilicity nor hydrophobicity), the first non-coordinating group Y1 and the second non-coordinating group Y2 can be self-assembled with the corresponding film layers of the quantum dot light emitting device when a quantum dot light emitting device is formed under the condition that the first non-coordinating group Y1 and the second non-coordinating group Y2 have the function of regulating the transport rate of carriers, so that different ligands of the quantum dot structure can be self-assembled to the desired surface. For example, after an anode, a hole injection layer, and a hole transport layer are sequentially formed on a base substrate of the quantum dot light emitting device, the hole transport layer being non-polar (i.e. having hydrophobicity), the first ligand of the quantum dot structure being also non-polar (i.e., having hydrophobicity), when the quantum dot structure is formed on the hole transport layer, the first ligand of the quantum dot structure has the same polarity as the hole transport layer, the action of the first ligand S1 with the hole transport layer is stronger with respect to the second ligand S2, so that the first ligand S1 is in contact with the hole transport layer and the second ligand S2 is arranged on a side of the quantum dot structure facing away from the base substrate so as to enhance the injection of the first carrier by the first ligand S1. In addition, since the ligands on the surfaces of the quantum dots can be adsorbed and desorbed in a solution, if the first ligand S1 and the second ligand S2 have the same polarity, even if a quantum dot structure with the first ligand S1 on one side and the second ligand S2 on the other side is synthesized, after being placed for a period of time, due to the motion of the ligands, eventually the first ligand S1 and the second ligand S2 will be evenly distributed on the surfaces of the quantum dots, which is not conducive to the stable preservation of the quantum dot structure. While the polarity of the first ligand S1 is different from that of the second ligand S2, which is conducive to forming different ligands on different sides of the quantum dots. If the first ligand S1 is hydrophilic, the modification of the first ligand S1 on the surfaces of the quantum dots can be performed in an aqueous phase solvent, and if the second ligand S2 is lipophilic, the modification of the second ligand S2 on the surfaces of the quantum dots can be performed in an oily phase solvent.

In some embodiments, the first sub non-coordinating group Y11 is one of the following groups:
  a hydrophilic group; for example, it can be hydroxyl or —(OCH2CH2)n-;
  a hydrophobic group; for example, it can be hydrocarbyl, a benzene ring or alkyl; or
  a non-hydrophilic and non-hydrophobic group; for example, it can be a fluorine atom or trifluoromethyl.

The third sub non-coordinating group is one of the following groups:
  a hydrophilic group; for example, it can be hydroxyl or (OCH2CH2)n;
  a hydrophobic group; for example, it can be hydrocarbyl, a benzene ring or alkyl; or
  a non-hydrophilic and non-hydrophobic group; for example, it can be a fluorine atom or trifluoromethyl.

In some embodiments, the first carrier may be the hole, and the first ligand has the property of promoting a transport rate of a first carrier, the second carrier may be the electron, and the second ligand has the property of promoting a transport rate of a second carrier. The second sub non-coordinating group Y12 may include one or a combination of: carbazole, triphenylamine, or arylamine. The fourth sub non-coordinating group Y22 may include one or a combination of: a benzene ring, or pyridine. In embodiments of the disclosure, the second sub non-coordinating group Y12 may include one or a combination of: carbazole, triphenylamine, or arylamine, and may have a promoting effect on the transport rate of holes. The fourth sub non-coordinating group Y22 may include one or a combination of: a benzene ring or pyridine, and may have a promoting effect on the transport rate of electrons.

In some embodiments, the second sub non-coordinating group Y12 and the fourth sub non-coordinating group Y22 may also be a group having a blocking effect on holes or electrons, such as long-chain alkyl or other non-conjugated structural groups.

In some embodiments, the first ligand S1 includes one or a combination of:

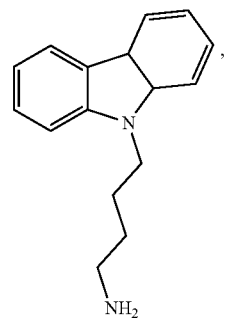 [SMILES: NCCCCN1c2ccccc2C2C=CC=CC21]

where the first coordinating group X1 is amino (NH2), the first sub non-coordinating group Y11 is hydrocarbyl, the second sub non-coordinating group Y12 is arylamine, and the first ligand S1 has hydrophobicity and has a promoting effect on the transport rate of holes;
or

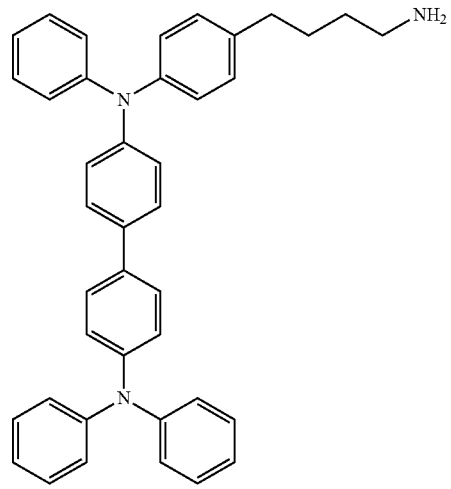 [SMILES: NCCCCc1ccc(N(c2ccccc2)c2ccc(-c3ccc(N(c4ccccc4)c4ccccc4)cc3)cc2)cc1]

where the first coordinating group X1 is amino (NH2), the first sub non-coordinating group Y11 is hydrocarbyl, the second sub non-coordinating group Y12 is arylamine, and the first ligand S1 has hydrophobicity and has a promoting effect on the transport rate of holes.

It should be noted that the above is that the first non-coordinating group Y1 and the second non-coordinating group Y2 have functions related to the polarity through two different groups, and have the related functions of regulating the transport rate of carriers. In some embodiments, the first non-coordinating group Y1 and the second non-coordinating group Y2 may also have functions related to the polarity through one group, and also have the function of regulating the transport rate of carriers. That is, the first non-coordinating group Y1 has the property of regulating the transport rate of the first carrier, and is one of the following groups: a hydrophilic group, a hydrophobic group, or a non-hydrophilic and non-hydrophobic group, the second non-coordinating group Y2 has the property of regulating the transport rate of the second carrier, and is one of the following groups: a hydrophilic group, a hydrophobic group, or a non-hydrophilic and non-hydrophobic group. The polarity of the first non-coordinating group Y1 is different from that of the second non-coordinating group Y2. For example, in some embodiments, the first ligand S1 and the second ligand S2 include one or a combination of:
- octyl; where the octyl may make the first ligand S1 hydrophobic, and the octyl also has a carrier (including electrons and holes) blocking effect, which may also regulate the transport rate of carriers;
- phenyl; where the phenyl can regulate carrier (including electrons and holes) transport, and the phenyl can also make the first ligand S1 hydrophobic;

where the molecule is a hydrophilic group, has hydrophilicity and a blocking effect on carriers (including electrons and holes), and when the molecule is used on the side of the electron transport layer of a quantum dot light emitting device, the injection of electrons can be reduced;

or

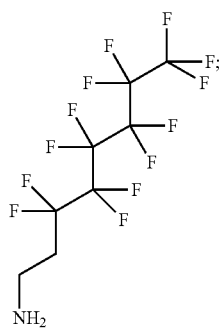

where the molecule is a fluorine-containing group and has characteristics of a fluorinated-solvent-philic while having a carrier (including electrons and holes) blocking effect, and when the molecule is used on the side of the electron transport layer of the quantum dot light emitting device, injection of electrons can be reduced.

Figure 2:
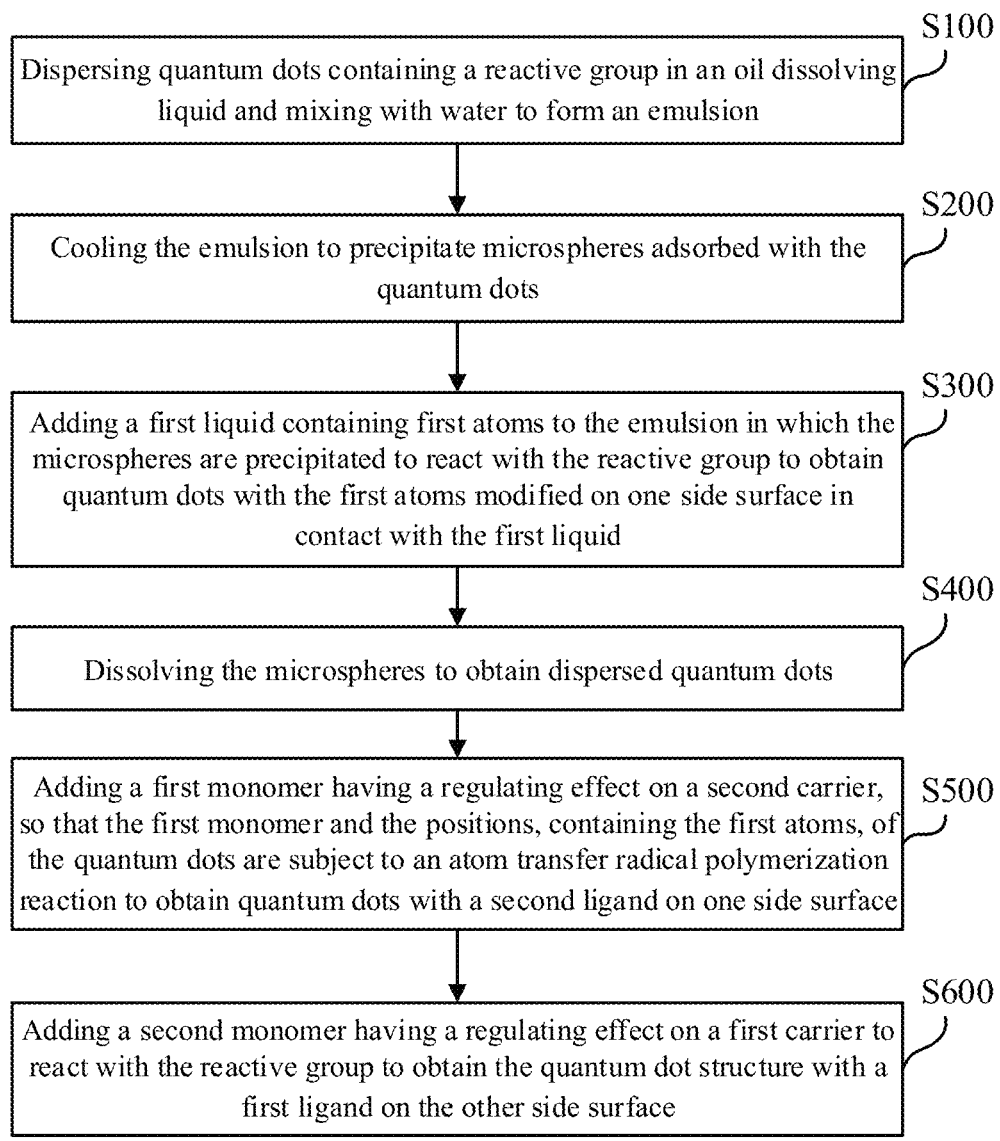
FIG. 2 is a schematic flow chart of manufacturing of a quantum dot structure according to an embodiment of the disclosure.

Based on the same inventive concept, with reference to FIG. 2, an embodiment of the disclosure also provides a manufacturing method for the quantum dot structure provided by the embodiment of the disclosure, including the following steps.

S100, dispersing quantum dots containing a reactive group in an oil dissolving liquid and mixing with water to form an emulsion; in some embodiments, the step may include: dispersing quantum dots containing an aminothiol ligand in molten paraffin liquid and mixing with water to form the emulsion, here mercapto is connected with the quantum dots, and amino is used as the reactive group.

S200, cooling the emulsion to precipitate microspheres adsorbed with the quantum dots.

S300, adding a first liquid containing first atoms to the emulsion in which the microspheres are precipitated to react with the reactive group to obtain quantum dots with the first atoms modified on one side surface in contact with the first liquid (i.e., the first atoms are not modified on the side in contact with the microspheres); specifically, the step may include: adding 2-bromoisobutyric acid containing bromine atoms to the emulsion in which the microspheres are precipitated to react with the amino to obtain quantum dots with bromine atoms modified on one side surface in contact with 2-bromoisobutyric acid; here the 2-bromoisobutyric acid, as an intermediate reactant, may function as a transitional linkage to avoid the situation that when the quantum dots cannot react directly with the second ligand, and linkage of the quantum dots with the second ligand cannot be realized, 2-bromoisobutyric acid may realize reaction and linkage of the quantum dots with the second ligand.

S400, dissolving the microspheres to obtain dispersed quantum dots.

S500, adding a first monomer having a regulating effect on a second carrier, so that the first monomer and the positions, containing the first atoms, of the quantum dots are subject to an atom transfer radical polymerization reaction to obtain quantum dots with a second ligand on one side surface.

S600, adding a second monomer having a regulating effect on a first carrier to react with the reactive group to obtain the quantum dot structure with a first ligand on the other side surface.

Figure 3:
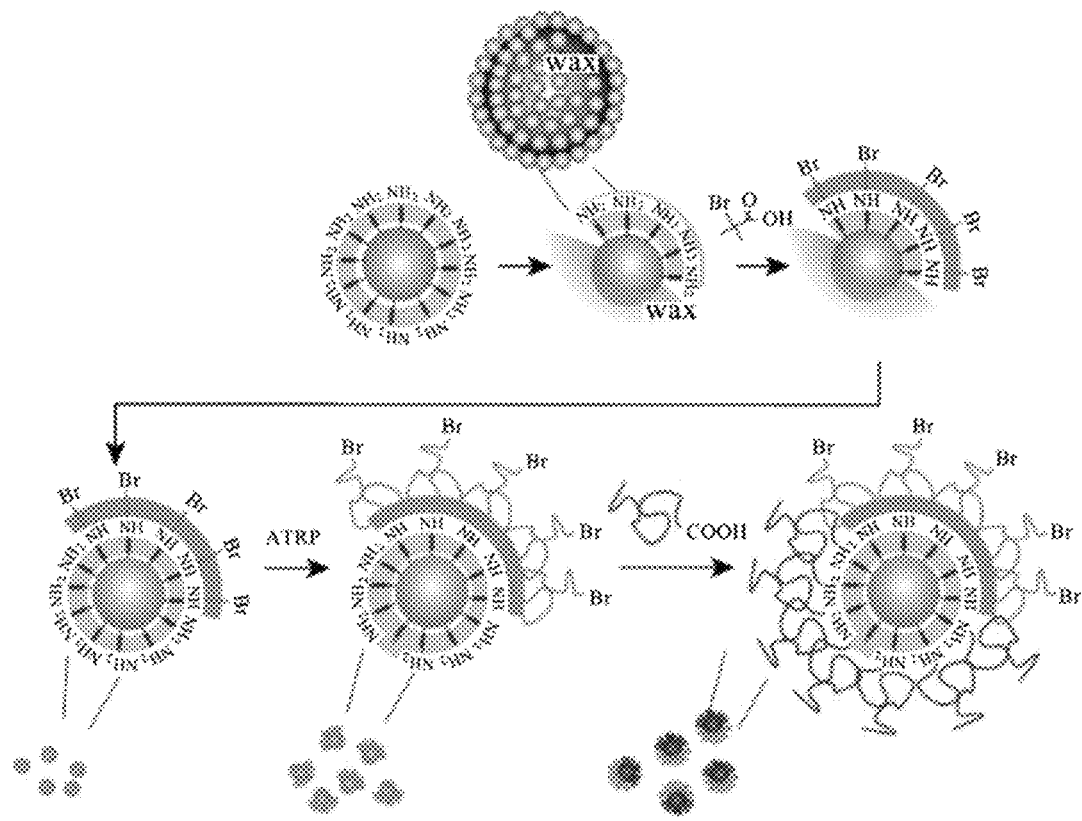
FIG. 3 is a schematic flow chart of a detailed manufacturing of a quantum dot structure according to an embodiment of the disclosure.

In order to provide a clearer understanding of the manufacturing method for the quantum dot structure provided by the embodiment of the disclosure, further details are described below according to the flow indicated by arrows shown in FIG. 3:

step 1, CdSe quantum dots containing an aminothiol ligand are dispersed in molten paraffin wax, here the mercapto is connected with the quantum dots and amino is used as a reactive group;

step 2, the paraffin solution of CdSe is mixed with warm water, and stirring is performed at a high speed to obtain an oil-in-water emulsion;

step 3, after cooling, paraffin microspheres are precipitated from the water, and the quantum dots are adsorbed on the surfaces of the paraffin microspheres;

step 4, 2-bromoisobutyric acid is added in water to react with amino to obtain quantum dots with bromine modified on one side;

step 5, the paraffin adsorbed with the quantum dots is filtered, and chloroform is added to dissolve the paraffin wax to obtain dispersed quantum dots;

step 6, a monomer blocking electrons is added, and atom transfer radical polymerization (ATRP) is performed at the positions containing bromine atoms to obtain quantum dots containing an electron blocking layer on one side; and step 7, carboxyl-containing small molecules with hole transport properties are added to react with amino to obtain a Janus-type quantum dot structure with two ligands.

Figure 4:
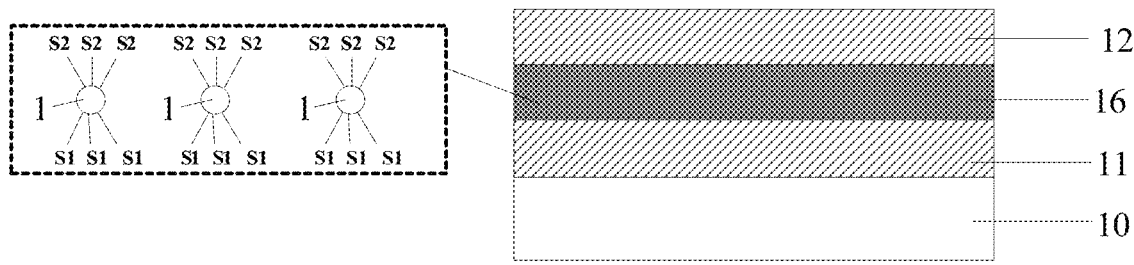
FIG. 4 is a schematic structural diagram of a quantum dot light emitting device according to an embodiment of the disclosure.

Based on the same inventive concept, and referring to FIG. 4, an embodiment of the disclosure also provides a quantum dot light emitting device, including:
- a base substrate 10;
- a first electrode 11, on a side of the base substrate 10;
- a second electrode 12, on a side of the first electrode 11 facing away from the base substrate 10; and a quantum dot structure 16, between the first electrode 11 and the second electrode 12, and the quantum dot structure 16 is the quantum dot light-emitting structure provided by the embodiment of the disclosure; one side surface, having a first ligand S1, of the quantum dot structure is located on the side of the quantum dot body 1 facing the first electrode 11, and configured to regulate a transport rate of a first carrier injected by the first electrode 11, and the other side surface, having a second ligand S2, of the quantum dot structure 16 is located on the side of the quantum dot body 1 facing the second electrode 12, and configured to regulate a transport rate of a second carrier injected by the second electrode 12.

Figure 5:
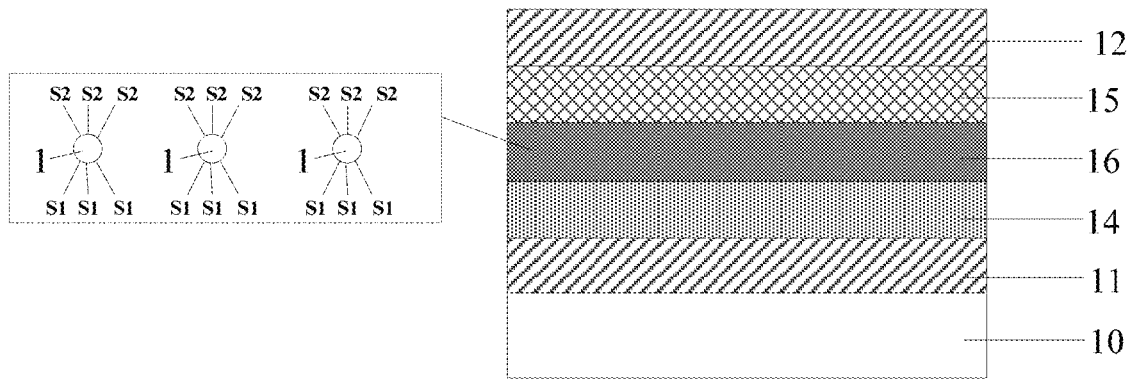
FIG. 5 is a schematic structural diagram of a detailed quantum dot light emitting device according to an embodiment of the disclosure.

In some embodiments, referring to FIG. 5, a first function layer 14 is formed between the quantum dot structure 16 and the first electrode 11, and the polarity of the first ligand S1 is the same as that of the first function layer 14; and a second function layer 15 is formed between the quantum dot structure 16 and the second electrode 12, and the polarity of the second ligand S2 is the same as that of the second function layer 15, which is exemplified below.

Figure 6A:
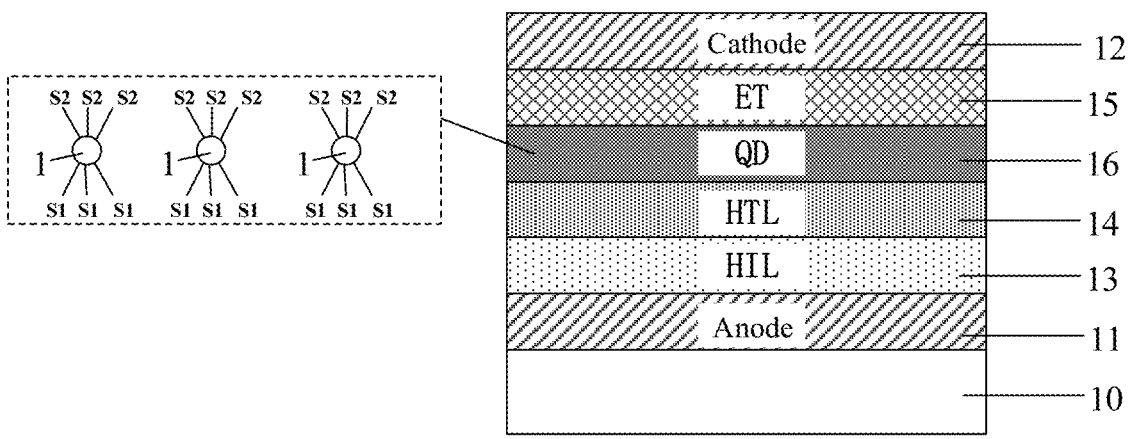
FIG. 6A is a schematic structural diagram of a quantum dot light emitting device in normal structure according to an embodiment of the disclosure.

For example, referring to FIG. 6A, the quantum dot light emitting device may be of a normal structure, the first electrode 11 may be an anode, the first function layer 14 may be a hole transport layer HTL, the second function layer 15 may be an electron transport layer ET, the second electrode 12 may be a cathode, the first ligand S1 may have a promoting effect on the transport rate of holes, and the second ligand S2 may have a blocking effect on the transport rate of electrons. In some embodiments, the quantum dot light emitting device may include an anode (a specific material may be ITO), a hole injection layer HIL (a specific material may be PEDOT), a hole transport layer (a specific material may be PVK), a quantum dot structure (a specific material may be QD), an electron transport layer (a specific material may be ZnO), and a cathode (a specific material may be Al), which are sequentially disposed on one side of the base substrate 10. PVK is non-polar, after spin-coating the quantum dots, the non-polar ligand on one sides of the quantum dots interacts more strongly with PVK and the quantum dot structure forms a structure with a hole transport ligand (the first ligand S1) facing downwards and an electron blocking ligand (the second ligand S2) facing upwards. Such a structure may enhance the transport of holes at the interface of the hole transport layer and block the injection of electrons at the interface of the electron transport layer, thus realizing the balance of carriers.

Figure 6B:
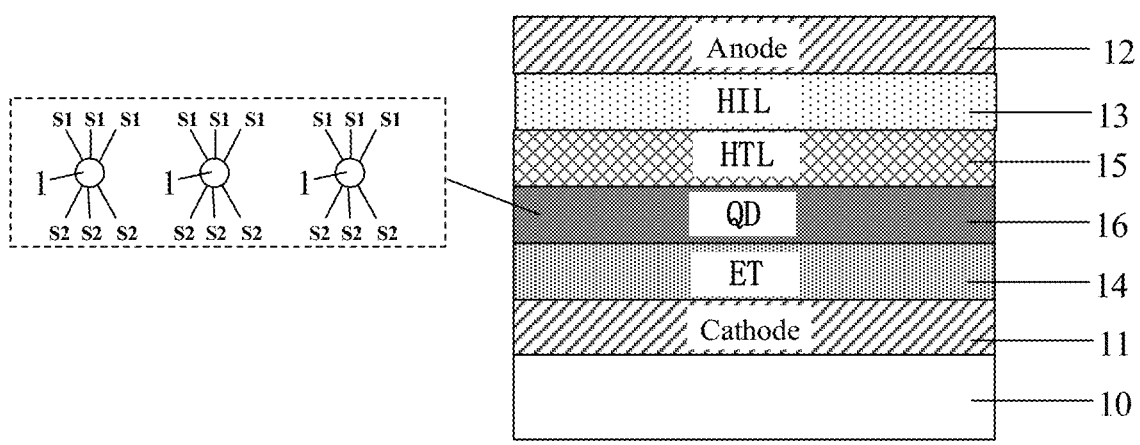
FIG. 6B is a schematic structural diagram of a quantum dot light emitting device in inverted structure according to an embodiment of the disclosure.

For another example, referring to FIG. 6B, the quantum dot light emitting device may be of an inverted structure, the first electrode 11 may be a cathode, the first function layer 14 may be an electron transport layer ET, the second function layer 15 may be a hole transport layer HET, the second electrode 12 may be an anode, the first ligand S1 may have a promoting effect on the transport rate of holes and the second ligand S2 may have a blocking effect on the transport rate of electrons. In some embodiments, the quantum dot light emitting device may include a cathode (a specific material may be ITO), an electron transport layer ET (a specific material may be ZnO), a quantum dot structure (a specific material may be QD), a hole transport layer HET (a specific material may be PVK), a hole injection layer HIL (a specific material may be PEDOT), and an anode (a specific material may be Al), which are sequentially disposed on one side of the base substrate 10. ZnO is polar, the polar ligand on the side interacts more strongly with ZnO after spin-coating the quantum dot structure (QD), and the quantum dot structure (QD) forms a structure with the electron blocking ligand (the second ligand S2) facing downwards and the hole transport ligand (the first ligand S1) facing upwards. Such a structure may enhance the transport of holes at the interface of the hole transport layer and block the injection of electrons at the interface of the electron transport layer, thus realizing the balance of carriers.

Figure 7:
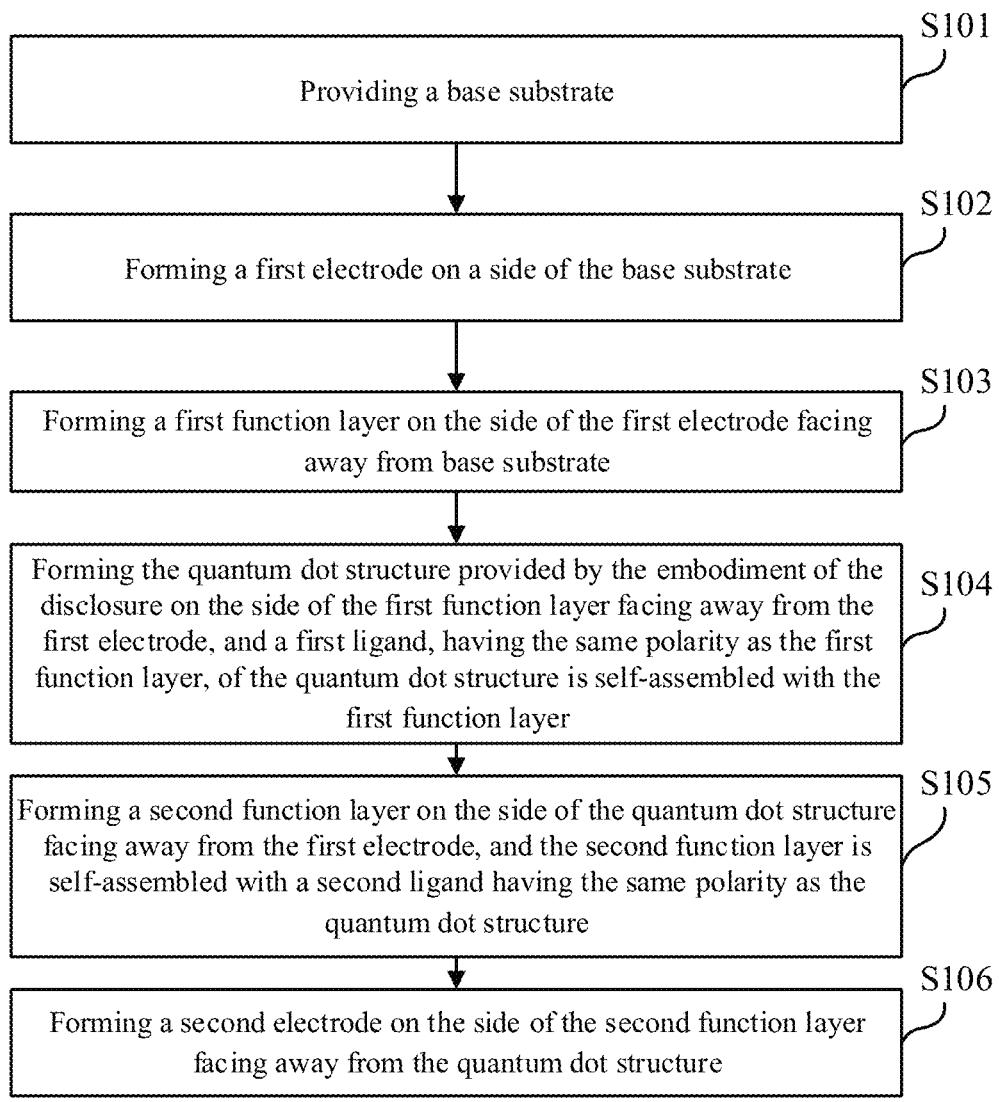
FIG. 7 is a schematic flow chart of manufacturing of a quantum dot light emitting device according to an embodiment of the disclosure.

Based on the same inventive concept, an embodiment of the disclosure also provides a manufacturing method for a quantum dot light emitting device, referring to FIG. 7, including:

S101, providing a base substrate;

S102, forming a first electrode on a side of the base substrate;

S103, forming a first function layer on the side of the first electrode facing away from the base substrate;

S104, forming the quantum dot structure provided by the embodiment of the disclosure on the side of the first function layer facing away from the first electrode, here a first ligand, having the same polarity as the first function layer, of the quantum dot structure is self-assembled with the first function layer;

S105, forming a second function layer on the side of the quantum dot structure facing away from the first electrode, here the second function layer is self-assembled with a second ligand of the quantum dot structure and the second function layer and the second ligand have the same polarity; and S106, forming a second electrode on the side of the second function layer facing away from the quantum dot structure.

The beneficial effects of the embodiments of the disclosure are as follows: in the embodiments of the disclosure, the quantum dot structure includes the first ligand on one side surface of the quantum dot body, and the second ligand on the other side surface of the quantum dot body, and the first ligand has the property of regulating the transport rate of the first carrier, and the second ligand has the property of regulating the transport rate of the second carrier, so that the transport rates of two carriers in opposite charge polarity can be regulated simultaneously by the quantum dot structure itself, and the injection balance of the two carriers can be controlled. Also, when the quantum dot structure is applied to the quantum dot light emitting device, the luminous efficiency of the quantum dot light emitting device can be effectively improved.

Obviously, those skilled in the art can make various changes and modifications to the disclosure without departing from the spirit and scope of the disclosure. Thus, if these changes and modifications of the disclosure fall within the scope of the claims of the disclosure and their equivalents, the disclosure is also intended to include these changes and modifications.

What is claimed is:

1. A quantum dot structure, comprising:
    a quantum dot body;
    a first ligand connected with a side surface of the quantum dot body by a first coordinate bond and having a property of regulating a transport rate of a first carrier; and
    a second ligand connected with other side surface of the quantum dot body by a second coordinate bond and having a property of regulating a transport rate of a second carrier;
    wherein the first carrier and the second carrier have opposite charge polarities;

the first ligand comprises a first coordinating group and a first non-coordinating group, and the first coordinating group is connected with the quantum dot body and the first non-coordinating group, and the first non-coordinating group has the property of regulating the transport rate of the first carrier; and the second ligand comprises a second coordinating group and a second non-coordinating group, and the second coordinating group is connected with the quantum dot body and the second non-coordinating group, and the second non-coordinating group has the property of regulating the transport rate of the second carrier;

wherein the first non-coordinating group comprises a first sub non-coordinating group and a second sub non-coordinating group, and the second sub non-coordinating group has the property of regulating the transport rate of the first carrier; the second non-coordinating group comprises a third sub non-coordinating group and a fourth sub non-coordinating group, and the fourth sub non-coordinating group has the property of regulating the transport rate of the second carrier; and a polarity of the first sub non-coordinating group is different from that of the third sub non-coordinating group; or the first non-coordinating group has the property of regulating the transport rate of the first carrier, and is one of following groups: a hydrophilic group, a hydrophobic group, or a non-hydrophilic and non-hydrophobic group; the second non-coordinating group has the property of regulating the transport rate of the second carrier, and is one of following groups: a hydrophilic group, a hydrophobic group, or a non-hydrophilic and non-hydrophobic group; wherein a polarity of the first non-coordinating group is different from that of the second non-coordinating group; or the first coordinating group and the second coordinating group comprise one or a combination of: mercapto; amino; carboxyl; or phosphoric acid.

2. The quantum dot structure according to claim 1, wherein a polarity of the first ligand is different from that of the second ligand.

3. The quantum dot structure according to claim 1, wherein the first sub non-coordinating group is one of following groups:
a hydrophilic group;
a hydrophobic group; or
a non-hydrophilic and non-hydrophobic group;
the third sub non-coordinating group is one of following groups:
a hydrophilic group;
a hydrophobic group; or
a non-hydrophilic and non-hydrophobic group.

4. The quantum dot structure according to claim 3, wherein
the hydrophilic group comprises one or a combination of:
hydroxyl; or
—(OCH2CH2)n-, wherein n≥1;
the hydrophobic group comprises one or a combination of:
hydrocarbyl;
a benzene ring; or
alkyl; and
the non-hydrophilic and non-hydrophobic group comprises one or a combination of:
a fluorine atom; or
trifluoromethyl.

5. The quantum dot structure according to claim 4, wherein the first carrier is a hole, the first ligand has a property of promoting the transport rate of the first carrier; and the second carrier is an electron, and the second ligand has a property of promoting the transport rate of the second carrier;

the second sub non-coordinating group comprises one or a combination of:
carbazole;
triphenylamine; or
arylamine;
the fourth sub non-coordinating group comprises one or a combination of:
a benzene ring; or
pyridine.

6. The quantum dot structure according to claim 5, wherein the first ligand comprises one or a combination of:

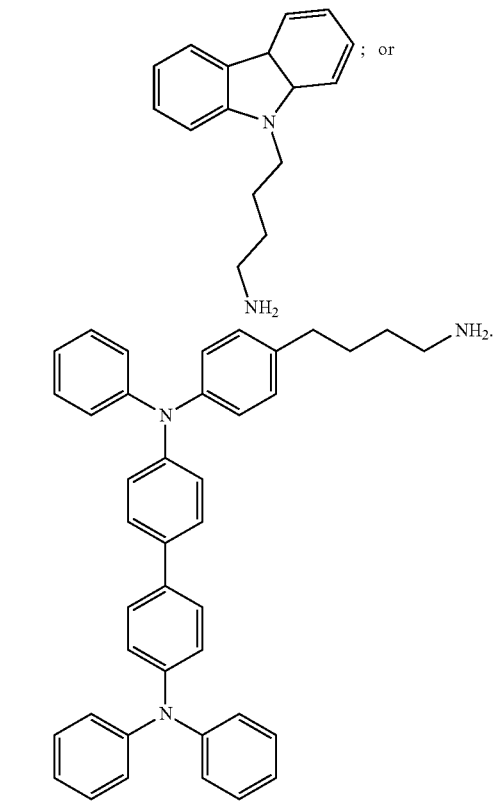

7. The quantum dot structure according to claim 4, wherein the first carrier is a hole, and the first ligand has a property of blocking the transport rate of the first carrier; and the second carrier is an electron, and the second ligand has a property of blocking the transport rate of the second carrier;

the second sub non-coordinating group comprises one or a combination of:
long-chain alkyl; or
a non-conjugated group;
the fourth sub non-coordinating group comprises one or a combination of:
long-chain alkyl; or
a non-conjugated group.

8. The quantum dot structure according to claim 1, wherein
the first ligand comprises one or a combination of:
octyl;
phenyl;

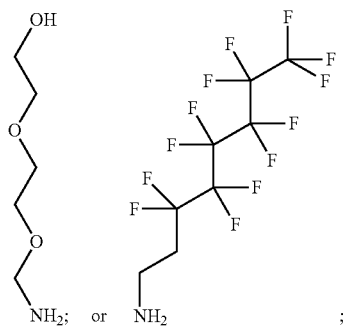 [SMILES: NCOCCOCCO ; NCCC(F)(F)C(F)(F)C(F)(F)C(F)(F)C(F)(F)C(F)(F)F]

the second ligand comprises one or a combination of:
octyl;
phenyl;

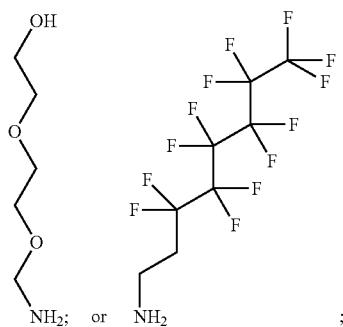 [SMILES: NCOCCOCCO ; NCCC(F)(F)C(F)(F)C(F)(F)C(F)(F)C(F)(F)C(F)(F)F]

9. The quantum dot structure according to claim 1, wherein the quantum dot body is of a core structure or the quantum dot body is of a core-shell structure.

10. A manufacturing method for the quantum dot structure according to claim 1, comprising:
dispersing quantum dots containing a reactive group in an oil dissolving liquid and mixing with water to form an emulsion;
cooling the emulsion to precipitate microspheres adsorbed with the quantum dots;
adding a first liquid containing first atoms to the emulsion in which the microspheres are precipitated to react with the reactive group to obtain quantum dots with the first atoms modified on a side surface in contact with the first liquid;
dissolving the microspheres to obtain dispersed quantum dots;
adding a first monomer having a regulating effect on the second carrier, and subjecting the first monomer and positions of the quantum dots containing the first atoms to an atom transfer radical polymerization reaction to obtain quantum dots with the second ligand on a side surface; and
adding a second monomer having a regulating effect on the first carrier to react with the reactive group to obtain the quantum dot structure with the first ligand on other side surface.

11. The manufacturing method according to claim 10, wherein the dispersing quantum dots containing a reactive group in an oil dissolving liquid and mixing with water to form an emulsion comprises:
dispersing quantum dots containing an aminothiol ligand in molten paraffin liquid and mixing with water to form the emulsion, wherein mercapto is connected with the quantum dots, and amino is used as the reactive group.

12. The manufacturing method according to claim 11, wherein the adding a first liquid containing first atoms to the emulsion in which the microspheres are precipitated to react with the reactive group to obtain quantum dots with the first atoms modified on the side surface in contact with the first liquid comprises:
adding 2-bromoisobutyric acid containing bromine atoms to the emulsion in which the microspheres are precipitated to react with the amino to obtain the quantum dots with the bromine atoms modified on the side surface in contact with the 2-bromoisobutyric acid.

13. A quantum dot light emitting device, comprising:
a base substrate;
a first electrode, on a side of the base substrate;
a second electrode, on a side of the first electrode facing away from the base substrate; and
a quantum dot structure, between the first electrode and the second electrode;
wherein the quantum dot structure is the quantum dot structure according to claim 1;
the side surface of the quantum dot structure having the first ligand is located on a side of the quantum dot body facing the first electrode, and configured to regulate the transport rate of the first carrier injected by the first electrode; and
the other side surface of the quantum dot structure having the second ligand is located on the side of the quantum dot body facing the second electrode, and configured to regulate the transport rate of the second carrier injected by the second electrode.

14. The quantum dot light emitting device according to claim 13, further comprising:
a first function layer between the quantum dot structure and the first electrode, and a polarity of the first ligand is same as that of the first function layer; and
a second function layer between the quantum dot structure and the second electrode, and a polarity of the second ligand is same as that of the second function layer.

15. A method for a manufacturing quantum dot light emitting device, comprising:
providing a base substrate;
forming a first electrode on a side of the base substrate;
forming a first function layer on a side of the first electrode facing away from the base substrate;
forming the quantum dot structure according to claim 1 on a side of the first function layer facing away from the first electrode, wherein the first ligand, having same polarity as the first function layer, of the quantum dot structure is self-assembled with the first function layer;
forming a second function layer on a side of the quantum dot structure facing away from the first electrode, wherein the second function layer is self-assembled with the second ligand having same polarity as the quantum dot structure; and
forming a second electrode on a side of the second function layer facing away from the quantum dot structure.

* * * * *